(12) United States Patent
Webster

(10) Patent No.: US 7,361,880 B2
(45) Date of Patent: Apr. 22, 2008

(54) DIGITAL CAMERA MODULE FOR DETACHABLY MOUNTING WITH FLEX PRINTED CIRCUIT BOARD

(75) Inventor: Steven Webster, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 11/478,503

(22) Filed: Jun. 28, 2006

(65) Prior Publication Data

US 2007/0057150 A1     Mar. 15, 2007

(30) Foreign Application Priority Data

Sep. 9, 2005     (CN) .................. 2005 1 0037227

(51) Int. Cl.
*H01L 27/00*     (2006.01)
*H01L 27/14*     (2006.01)
*H01L 23/02*     (2006.01)
*H01L 23/52*     (2006.01)

(52) U.S. Cl. .................. 250/208.1; 250/239; 257/431; 257/433; 257/731; 257/732; 257/690; 257/727

(58) Field of Classification Search ............. 250/208.1, 250/214 R, 214.1; 257/431–434, 678, 680, 257/690, 727, 731–732; 348/373–376, 552

See application file for complete search history.

(56) References Cited

U.S. PATENT DOCUMENTS

| | | | | |
|---|---|---|---|---|
| 6,649,834 | B1 * | 11/2003 | Hsieh et al. | 174/527 |
| 6,680,525 | B1 * | 1/2004 | Hsieh et al. | 257/680 |
| 6,870,208 | B1 * | 3/2005 | You et al. | 257/291 |
| 2001/0030276 | A1 * | 10/2001 | Hoshino | 250/208.1 |
| 2004/0251510 | A1 * | 12/2004 | You et al. | 257/433 |
| 2005/0253211 | A1 * | 11/2005 | Minamio et al. | 257/432 |
| 2005/0258518 | A1 * | 11/2005 | Yang et al. | 257/666 |

\* cited by examiner

*Primary Examiner*—Davienne Monbleau
(74) *Attorney, Agent, or Firm*—Jeffrey T. Knapp

(57) ABSTRACT

A digital camera module (100) includes a holder, an image sensor chip package (30), a number of conductive elements (24) and a circuit board (40). The holder defines a receiving portion. The holder is mounted on the image sensor chip package. The image sensor chip package has a number of outer pads. The outer pads are positioned in the receiving portion of the holder. The conductive elements are received in the receiving portion. One end of each of the conductive elements is connected to the inner pads, the other end of each of the conductive elements is connected to the circuit board.

19 Claims, 2 Drawing Sheets

DIGITAL CAMERA MODULE FOR DETACHABLY MOUNTING WITH FLEX PRINTED CIRCUIT BOARD

TECHNICAL FIELD

The present invention relates generally to a digital camera module, and more particularly, to a digital camera module mounted in a portable electronic device, such as a mobile phone or a personal digital assistant (PDA).

BACKGROUND

With the development of wireless communication technologies, increasing numbers of mobile phones and PDAs now include digital cameras as a special feature.

Generally, digital cameras modules are mounted in printed circuit boards (PCBs) of portable electronic devices by surface mounted technology (SMT) or heat pressing technology. However manufacturers have discovered that this structure is complicated and not suited for assembly.

A typical digital camera module 50 is illustrated in FIG. 2. The digital camera module 50 includes a seat 51, a barrel 52, an image sensor package 60 and a flex printed circuit board (FPCB) 70. The barrel 52 is mounted in the seat 51. The seat 51 is fixed on the image sensor package 60. The FPCB 70 is set in a connector 80 at one end thereof. The FPCB 70 has a flexible characteristic, and may be rotated or twisted. The end of the FPCB 70 opposite to the connector 80 is mounted on outside pad area 62 of the image sensor package 60. The connector 80 is also connected to a corresponding connector of portable electronic device. Accordingly, the connector 80 may transmit electronically signals from the image sensor package 60 to a portable electronic device (not shown). Owing to the flexible characteristics of the FPCB 70, the digital camera module 50 can be fitted around other devices in a portable electronic device thus making more efficient use of space. However, after the digital camera module is packaged, the image sensor package is fixedly connected to the FPCB 70. If the image sensor package is rejected during quality-control, then FPCB 70 will be wasted. Thus making this an overly expensive process.

Therefore, a new digital camera module is desired in order to overcome the above-described shortcomings.

SUMMARY

One embodiment of a digital camera module includes a holder, an image sensor chip package, a plurality of conductive elements and a circuit board. The holder defines a receiving portion. The holder is mounted on the image sensor chip package. The image sensor chip package has a plurality of outer pads. The outer pads are positioned in the receiving portion of the holder. The conductive elements are received in the receiving portion. One end of each of the conductive elements is connected to the inner pads, the other end of each of the conductive elements is connected to the circuit board.

Other advantages and novel features will become more apparent from the following detailed description when taken in conjunction with the accompanying drawings.

BRIEF DESCRIPTION OF THE DRAWINGS

Many aspects of the present digital camera module can be better understood with reference to the following drawings. The components in the drawings are not necessarily drawn to scale, the emphasis instead being placed upon clearly illustrating the principles of the digital camera module. Moreover, in the drawings, like reference numerals designate corresponding parts throughout the several views.

DETAILED DESCRIPTION OF THE PREFERRED EMBODIMENTS

Figure 1:
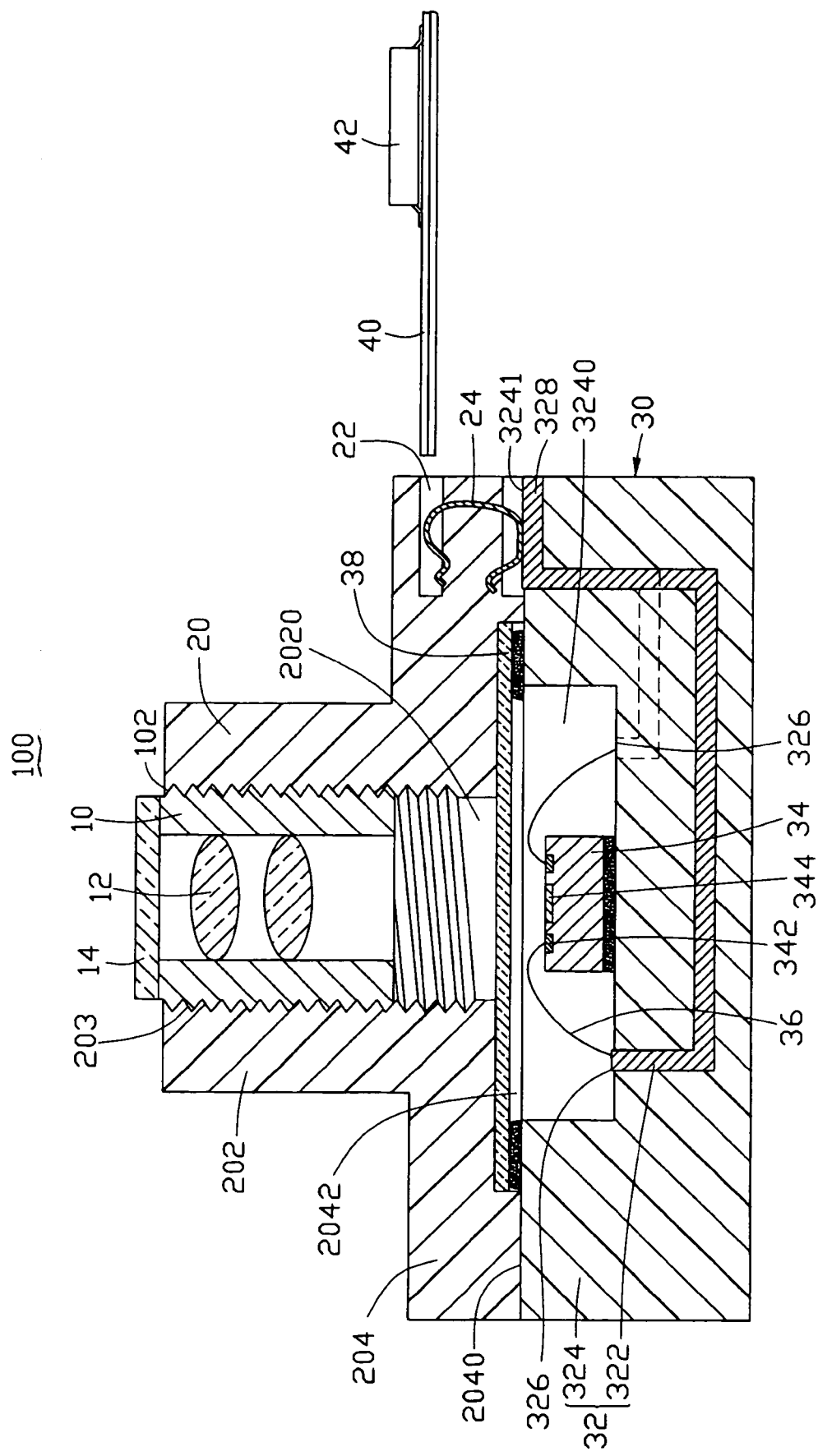
FIG. 1 is a schematic, cross-sectional view of a digital camera module according to a preferred embodiment.
Figure 2:
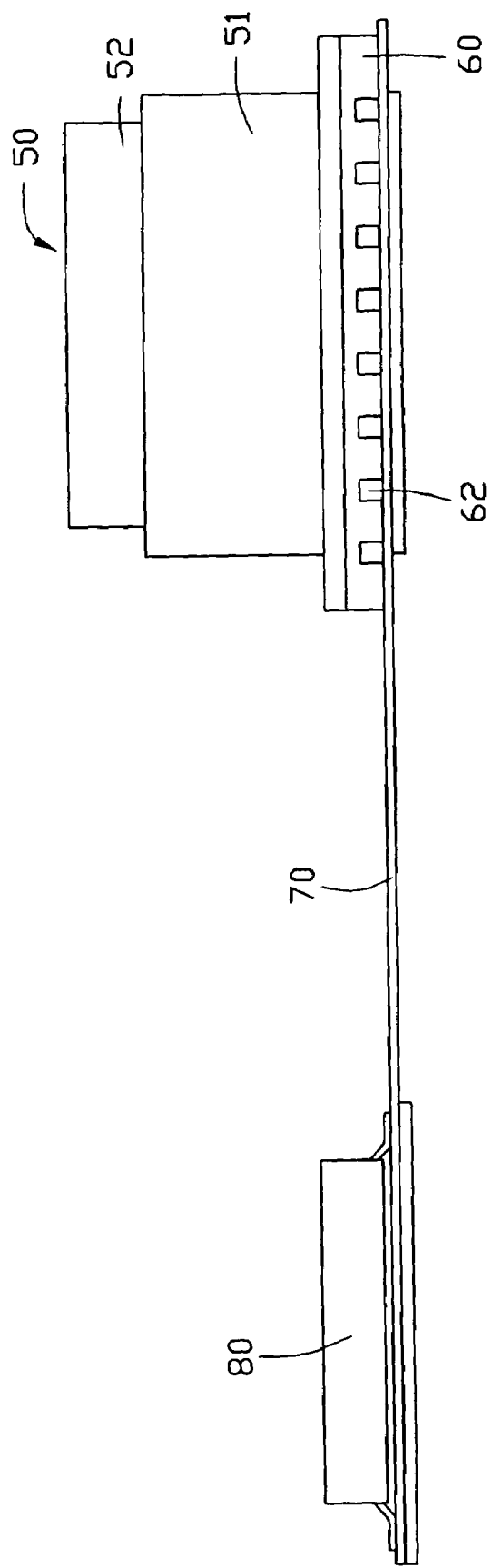
FIG. 2 is a schematic view of a conventional digital camera module.

Referring to FIG. 1, a digital camera module 100 includes a barrel 10, a seat 20, a plurality of elastic clips 24, an image sensor chip package 30, and a circuit board 40 in accordance with a preferred embodiment. The image sensor chip package 30 includes a carrier 32, a chip 34, a number of bonding wires 36 and a cover 38.

The barrel 10 is substantially a hollow cylinder with two open ends so that light can be transmitted therethrough. Several lens elements 12 are secured in the barrel 10, and receive incoming light that enters from the outside. The barrel 10 has an outer thread 102 defined in an outer periphery wall thereof. A glass board 14 is placed before the lens elements 12 and covers one end of the barrel 10. As such, the glass board 14 protects the lens elements 12 from being scraped or otherwise abraded and keeps dust from entering the system.

The seat 20 includes a seat body 202 and a flange 204 formed together. The seat body 202 is a cylinder. A hole 2020 is defined in the seat body 202 and the flange 204 in a central area. The flange 204 is formed at a bottom end of the seat body 202. The flange 204 is a long cube, and has a bottom portion 2040. The bottom portion 2040 defines a rectangular cavity 2042 in a middle thereof opposite to the seat body 202. The rectangular cavity 2042 communicates with the hole 2020 so that light can be transmitted therethrough. An outer diameter of the seat body 202 is smaller than that of an edge of the flange 204 so that a step is formed at a connection between them. An inner periphery wall of the seat body 202 defines an inner thread 203, for engaging with the outer thread 102 of the barrel 10. The flange 204 defines two parallel spaced grooves 22 at one side thereof One of the grooves 22 adjacent to the bottom portion 2040 communicates with the bottom portion 2040.

The elastic clips 24 are substantially C-shaped. The elastic clips 24 are arranged to be secured in the grooves 22. One of two ends of the clips 24 and a middle portion are embedded in the flange 204, the other portions are contained in the grooves 24. The clips 24 may be formed in the seat 20 when molding.

The carrier 32 of the image sensor chip package 30 is positioned under the seat 20 so as to carry the image sensor chip 34. The carrier 32 includes a plurality of conductive pieces 322 and a plastic base 324. The conductive pieces 322 and the plastic base 324 cooperatively form the carrier 32 by insert-molding.

The plastic base 324 is a long cube, and defines a rectangular receiving groove 3240. The base 324 has a top surface 3241. The top surface 3241 is joined to the bottom portion 2040 of the flange 204. The conductive pieces 322 are made up of many metal plates. The conductive pieces 322 are arranged so as to be spaced from each other and partially enclosed in the base 324 by insert-molding. One end of each of the conductive pieces 322 is exposed in the receiving groove 3240, thus forming a plurality of inner pads 326. An opposite end of each of the conductive pieces 322 is exposed from the top surface 3241 of the base 324, thus forming a number of outer pads 328. The outer pads 328 are also positioned in the groove 22 adjacent to the base 324. The inner pads 326 are connected to the image sensor 34. The outer pads 328 may be electronically connected to the elastic clips 24.

The image sensor chip 34 is adhered to the bottom of the receiving groove 3240 of the carrier. A top surface of the image sensor chip 34 is arranged with a photosensitive area 344 and a number of chip pads 342 arrayed around the photosensitive area 344.

The bonding wires 36 can be made of a conductive material such as gold or aluminum alloy. One end of each wire 36 is connected/joined to a respective chip pad 342 of the image sensor chip 34, and the other end of the wire 36 is connected/joined to a respective inner pad 326 so as to transmit electric signals out of the image sensor chip package 30 to the outer pad 328.

The cover 38 is transparent and is laid over the image sensor chip 34 which receives light transmitted through the cover 38. The cover 38 is adhered on the base 324 by glue and therefore seals the image sensor chip 34 in the cavity of the base 324.

The circuit board 40 is a flexible printed circuit board (FPCB), which is arranged a plurality of wires. One end of the circuit board 40 is set a connector 42, the other end of the circuit board 40 is set a plurality of conductive terminals (not labeled). The wires are connected the conductive terminals to the connector 42. The circuit board 40 may be inserted into the groove 22 far from the top surface 3241 of the base 324 so as to cause each conductive terminal to be electronically connected to a corresponding clip 24.

In making the camera module 100, firstly, the conductive pieces 322 and the plastic base 324 are together formed by insert-molding, thereby forming the carrier 32. Then, the image sensor chip 34 is adhered in the carrier 32. After that, the bonding wires 36 are connected to the chip pad 342 and the inner pads 326. The cover 38 is adhered on the base 324 by glue and therefore seals the image sensor chip 34 in the cavity of the base 324. The clips 24 are together formed with the seat 20 by insert-molding, with two parallel grooves 22. The clips 24 are arranged to secure in the grooves 22.

Several lens elements 12 are received in the barrel 10. The outer thread 102 of the barrel 10 engages with the inner thread 201 of the seat 20, whereby the barrel 10 and the seat 20 are connected with each other. The seat 20 is then mounted on the image sensor chip package 30 by welding/glue, with the image sensor 34 aligning with the lens elements 12. At the same time, the cover 38 is received in the rectangular cavity 2042. The clips 24 are electronically connected to the outer pads 328 of the carrier 32. Finally, the circuit board 40 is inserted into the groove 24 far from the top surface 3241 of the base 324. Accordingly, the circuit board 40 is electronically connected to the clips 24. Owing to the elastic characteristic of the clips 24, the circuit board 40 is tightly received in the groove 22, thereby avoiding the circuit board 40 become separated from the digital camera module. The assembly process of the digital camera module is thus completed.

In an alternative embodiment, the arrangement of the conductive pieces 322 can be changed so long as the conductive pieces 322 are spaced from each other. The base 324 can be of another shape such as cylinder-shaped, or column-shaped with a pentagonal or hexagonal cross-section.

In the above embodiments, the clips may be replaced with other structures such as metal conductive pieces. The barrel 10 and the seat 20 together may act as a holder to be mounted on the image sensor package 30. Understandably, the seat 20 may be omitted. The holder only has a barrel, and is directly mounted on the image sensor package 30. Alternatively, the barrel 10 may be omitted, the holder only has a seat. The lens elements are placed in the seat 20, and the seat 20 is mounted on the image sensor package 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A digital camera module comprising:
   a holder defining a receiving portion;
   an image sensor chip package, the holder mounted on the image sensor chip package, the image sensor chip package comprising:
   a carrier comprising a conductive means and a base, the conductive means forming a plurality of outer pads outside the base and a plurality of inner pads in the base, the outer pads positioned in the receiving portion of the holder;
   an image sensor chip mounted on the base, the image sensor chip having a photosensitive area and a plurality of chip pads around the photosensitive area;
   a plurality of wires each electronically connecting one of the chip pads of the image sensor chip with a corresponding one of the inner pads of the conductive means;
   a plurality of clips being received in the receiving portion, one end of each of the clips connected to the outer pads; and
   a circuit board, the circuit board being electrically connected to the other end of each of the clips.

2. The digital camera module as claimed in claim 1, wherein the receiving portion defines two grooves, and two ends of the clips are secured in the grooves.

3. The digital camera module as claimed in claim 1, wherein the clips are elastic, and are C-shaped.

4. The digital camera module as claimed in claim 1, wherein the circuit board is a flex printed circuit board.

5. The digital camera module as claimed in claim 1, wherein the holder includes a barrel and a seat, the barrel receives at least one lens element, and the seat is fixed on the image sensor chip package.

6. The digital camera module as claimed in claim 5, wherein the receiving portion defines two grooves, and the grooves are defined in the seat.

7. The digital camera module as claimed in claim 6, wherein the seat includes a seat body and a flange, the grooves are defined at one side of the flange, and one of grooves communicates with one end of the flange opposite to the seat body.

8. A digital camera module comprising:
   a holder defining at least one receiving groove;
   an image sensor chip package, the holder mounted on the image sensor chip package, the image sensor chip package having an image sensor chip and a plurality of outer pads, the outer pads positioned in a given said receiving groove of the holder, the image sensor chip being electronically connected with the outer pads;

a plurality of conductive elements being received in a given said receiving groove one end of each of the conductive elements being connected to the outer pads each of the conductive elements being an elastic clip; and a circuit board, the circuit board being connected to another end of each of the conductive elements.

9. The digital camera module as claimed in claim 8, wherein the at least one receiving groove includes two parallel spaced grooves.

10. The digital camera module as claimed in claim 9, wherein the clips are C-shaped.

11. The digital camera module as claimed in claim 9, wherein the holder is a barrel, the barrel is a hollow cylinder, and at least one lens element is positioned in the barrel.

12. The digital camera module as claimed in claim 11, further comprising a seat, the seat including a seat body and a flange, the seat body being connected to the barrel by thread, and the flange being mounted on the image sensor chip package.

13. The digital camera module as claimed in claim 12, wherein the barrel includes a glass board, and the glass board is placed on one end of the barrel.

14. The digital camera module as claimed in claim 8, wherein the holder is a seat, the seat includes a seat body and a flange, the seat is a hollow cylinder, at least one lens elements are positioned in the seat body, and the flange is mounted on the image sensor chip package.

15. The digital camera module as claimed in claim 14, wherein the at least one receiving groove includes two grooves defined at the flange, the flange includes a bottom portion, and one of the two grooves communicates with the bottom portion.

16. A digital camera module comprising:

a holder comprising a lens allowing incoming light to be transmitted therethrough, and a plurality of first conductive pieces positioned therein, each of the first conductive pieces forming a first conductive portion and a second conductive portion;

a circuit board electrically connected with the first conductive portions of the first conductive pieces;

a chip carrier attached to the holder, the chip carrier comprising an insulative base with a plurality of second conductive pieces positioned therein, each of the second conductive pieces having an inner pad and an outer pad, the outer pad of each of the second conductive pieces being electrically connected with the second portion of a corresponding one of the first conductive pieces;

an image sensor chip positioned on the carrier so as to receive the light transmitted through the lens and generate an image signal associated with the light, the image sensor chip having a photosensitive area and a plurality of chip pads arrayed round the photosensitive area, the chip pads being each electrically connected to the inner pad of a corresponding one of the second conductive pieces thus allowing transmission of the associated image signal from the image sensor chip to the circuit board.

17. The digital camera module of claim 16, wherein each of the first conductive pieces is a single piece and embedded in the holder.

18. The digital camera module of claim 16, wherein the first portions of the first conductive pieces are structured so as to resiliently contact with the circuit board.

19. The digital camera module of claim 18, wherein the holder defines a groove for receiving the first portions, and the first portions resists the circuit board against the holder in the groove thereof.

* * * * *